US012638710B2

(12) United States Patent
Li et al.

(10) Patent No.: US 12,638,710 B2
(45) Date of Patent: May 26, 2026

(54) DISPLAY PANEL AND DISPLAY APPARATUS

(71) Applicants: Hefei BOE Optoelectronics Technology Co., Ltd., Hefei (CN); BOE Technology Group Co., Ltd., Beijing (CN)

(72) Inventors: Cheng Li, Beijing (CN); Xiaojie Zhang, Beijing (CN); Sheng Wang, Beijing (CN); Yuanyuan Pan, Beijing (CN); Jinming Zhu, Beijing (CN); Jielian Shen, Beijing (CN)

(73) Assignees: Hefei BOE Optoelectronics Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 72 days.

(21) Appl. No.: 18/637,041

(22) Filed: Apr. 16, 2024

(65) Prior Publication Data

US 2024/0329456 A1      Oct. 3, 2024

Related U.S. Application Data

(63) Continuation of application No. PCT/CN2023/085674, filed on Mar. 31, 2023.

(51) Int. Cl.
*G02F 1/1335* (2006.01)
*H10K 59/35* (2023.01)
*H10K 59/80* (2023.01)

(52) U.S. Cl.
CPC ..... *G02F 1/133512* (2013.01); *H10K 59/353* (2023.02); *H10K 59/8792* (2023.02)

(58) Field of Classification Search
CPC ......... G02F 1/134309; G02F 1/133512; G02F 1/136209
See application file for complete search history.

(56) References Cited

U.S. PATENT DOCUMENTS

2024/0295778 A1*   9/2024   Zeng ................ G02F 1/133512

FOREIGN PATENT DOCUMENTS

| CN | 105511152 A | 4/2016 |
| CN | 107255883 A | 10/2017 |
| CN | 107678720 A | 2/2018 |
| CN | 108364568 A | 8/2018 |
| CN | 111276043 A | 6/2020 |

* cited by examiner

*Primary Examiner* — David Y Chung
(74) *Attorney, Agent, or Firm* — IPro, PLLC

(57) ABSTRACT

Provided by the present disclosure are a display panel and a display apparatus. The display panel has a display area, the display area has an irregular boundary and includes a main display area and a transition display area between the main display area and the irregular boundary; the display area includes a plurality of sub-pixels arranged in an array along a row direction and a column direction, each sub-pixel in the transition display area has a light-shielding block, and an area of the light-shielding block is smaller than an area of the sub-pixel; the transition display area is divided into a first area, a second area and a third area successively disposed in sequence along an extension direction of the irregular boundary; in the first area and the third area, each sub-pixel includes one light-shielding block, and the light-shielding block in each sub-pixel is provided close to the irregular boundary.

20 Claims, 7 Drawing Sheets

DISPLAY PANEL AND DISPLAY APPARATUS

CROSS-REFERENCE TO RELATED APPLICATIONS

This application is a continuation of International Application No. PCT/CN2023/085674, filed on Mar. 31, 2023, which is hereby incorporated by reference in its entirety.

TECHNICAL FIELD

The present disclosure relates to the field of display technology, and in particular to a display panel and a display apparatus.

BACKGROUND

With the continuous development of display technology, users have increasingly high requirements for narrow bezels of display panels, and in order to meet users' requirements, blind holes (AA Hole) are usually set in the AA (Active Area, active display area) area of the display panel for integrating some optical components, and the blind holes can be in the shape of a circle or an ellipse, etc., to realize narrow bezels.

In addition, with the application of display technology in smart wearable and other portable electronic devices, there are diversified requirements for the shapes of the display panels, and consequently, irregular shaped display panels, such as circular or curved screen display products have become very common.

However, both the blind hole design and the irregular shaped display panel design described above make the AA area of the display panel have a circular curved irregular boundary, so that in the display area close to the irregular boundary, the pixel units and the irregular boundary line do not fully cooperate, so that the pixel units are arranged in a jagged shape close to the edges of the irregular boundary, which causes the display area close to the irregular boundary to present a visual effect of jaggedness when displayed. As a result, the pattern at the position where the irregular boundary is located is not rounded and smooth, affecting the display effect of the display area near the irregular boundary.

SUMMARY

Embodiments of the present disclosure provide a display panel and a display apparatus, and the specific schemes are as follows.

Embodiments of the present disclosure provide a display panel having a display area, the display area has an irregular boundary and the display area includes a main display area; and a transition display area between the main display area and the irregular boundary;

the display area includes a plurality of sub-pixels arranged in an array along a row direction and a column direction, each sub-pixel in the transition display area has a light-shielding block, and an area of the light-shielding block is smaller than an area of the sub-pixel;

the transition display area is divided into a first area, a second area and a third area successively disposed in sequence along an extension direction of the irregular boundary;

in the first area and the third area, each sub-pixel includes one light-shielding block, and the light-shielding block in each sub-pixel is provided close to the irregular boundary; and in the second area, each sub-pixel includes two light-shielding blocks, and one of the two light-shielding blocks in each sub-pixel is provided close to the first area, and the other one of the two light-shielding blocks is provided close to the third area.

In a possible embodiment, in the above display panel provided in the embodiments of the present disclosure, the irregular boundary includes circular or oval, the transition display area is arranged around the irregular boundary, and the transition display area further includes a fourth area between the first area and the third area; and in the fourth area, each sub-pixel includes two light-shielding blocks, and one of the two light-shielding blocks in each sub-pixel blocks a portion of the sub-pixel close to the first area, and the other one of the two light-shielding blocks blocks a portion of the sub-pixel close to the third area.

In a possible embodiment, in the above display panel provided in the embodiments of the present disclosure, a plurality of sub-pixels adjacent to each other and having different light-emitting colors form a pixel unit, and various sub-pixels in a same pixel unit located within the transition display area have light-shielding blocks of the same area.

In a possible embodiment, in the above display panel provided in the embodiments of the present disclosure, the display area includes a first centerline extending along the column direction and a second centerline extending along the row direction, the first area includes a first sub-area and a second sub-area located at both sides of the first centerline; and in the first sub-area and the second sub-area, at least one pixel unit is provided in each row, and areas of light-shielding blocks in various pixel units of each row gradually decrease along the row direction and along a direction in which the transition display area points toward the main display area.

In a possible embodiment, in the above display panel provided in the embodiments of the present disclosure, pixel units located within the main display area are first pixel units and pixel units located within the transition display area are second pixel units; and in the first sub-area and the second sub-area, except for a second pixel unit in a first row, a second pixel unit, closest to the irregular boundary, of second pixel units in the remaining rows is located in a same column as a first pixel unit, closest to the irregular boundary, of first pixel units in a previous row.

In a possible embodiment, in the above display panel provided in the embodiments of the present disclosure, the first sub-area and the second sub-area are symmetrically arranged about the first centerline.

In a possible embodiment, in the above display panel provided in the embodiments of the present disclosure, the third area and the first area are symmetrically arranged about the second centerline.

In a possible embodiment, in the above display panel provided in the embodiments of the present disclosure, the second area includes a third sub-area and a fourth sub-area arranged at both sides of the second centerline; and in the third sub-area and the fourth sub-area, a pixel unit closest to the irregular boundary in each row has the light-shielding block, at least one pixel unit is provided in each column, and areas of light-shielding blocks in various pixel unit in a same column gradually increase along the column direction.

In a possible embodiment, in the above display panel provided in the embodiments of the present disclosure, the third sub-area and the fourth sub-area are symmetrically arranged about the second centerline.

In a possible embodiment, in the above display panel provided in the embodiments of the present disclosure, the fourth area and the second area are symmetrically arranged about the first centerline.

In a possible embodiment, in the above display panel provided in the embodiments of the present disclosure, the first area and the third area have a central angle of 71° to 81° and the second area has a central angle of 99° to 109°.

In a possible embodiment, in the above display panel provided in the embodiments of the present disclosure, the first area and the third area have a central angle of 76°, and the second area has a central angle of 104°.

In a possible embodiment, in the above display panel provided in the embodiments of the present disclosure, a shape of the light-shielding block and a shape of the sub-pixel are rectangles, and a width of the light-shielding block is same as a width of the sub-pixel. In a possible embodiment, in the above display panel provided in the embodiments of the present disclosure, the two light-shielding blocks in each sub-pixel are symmetrically arranged about a center of the sub-pixel in the second area and the fourth area.

Correspondingly, embodiments of the present disclosure further provide a display apparatus, including the above display panel provided by the embodiments of the present disclosure, where a shape of the display area of the display panel includes circular or oval; or the display area of the display panel has a circular or oval blind hole for placing an optical component.

DETAILED DESCRIPTION

Figure 1:
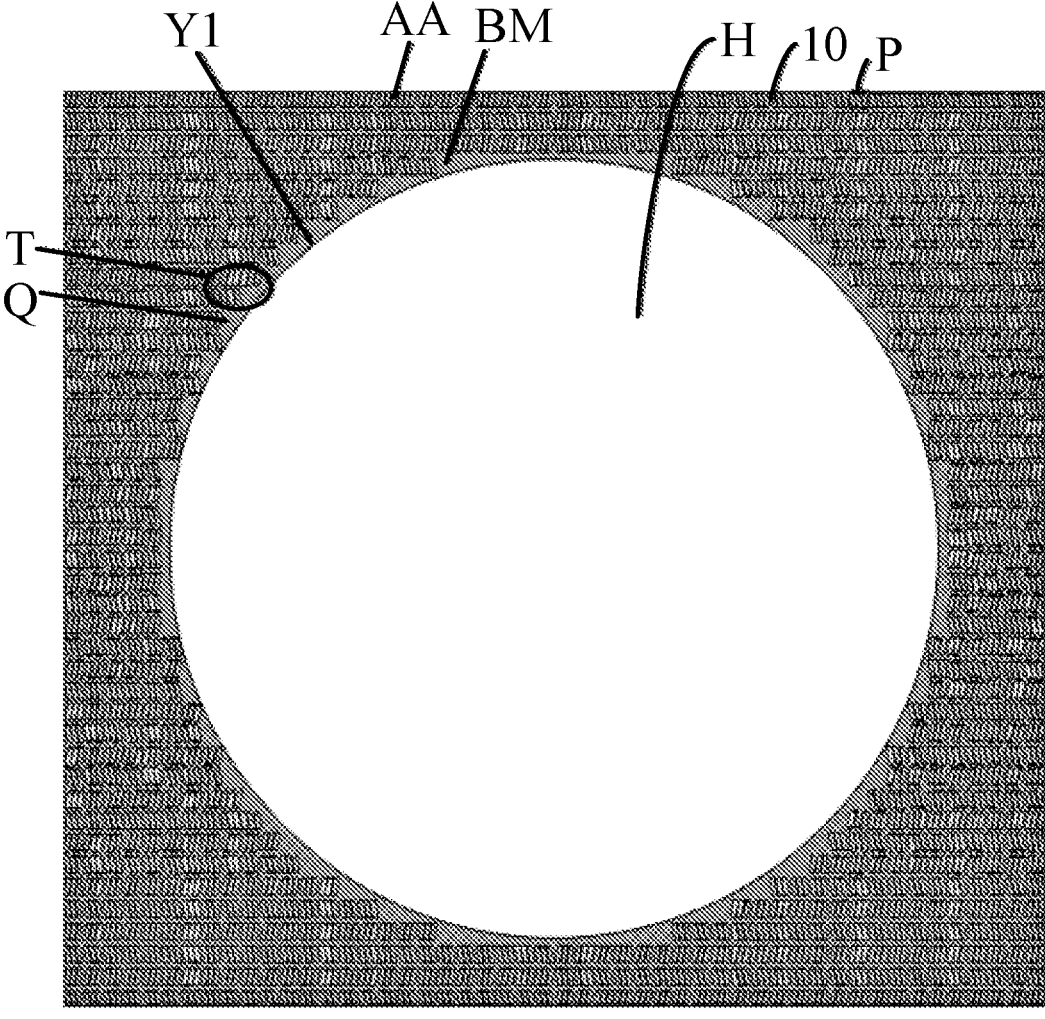
FIG. 1 is a schematic diagram of a pixel structure in which a blind hole is provided in an AA area of a display panel in the related art.

In order to make the objectives, technical solutions and advantages of the embodiments of the present disclosure clearer, the technical solutions of the embodiments of the present disclosure are described clearly and completely below with reference to the drawings of the embodiments of the present disclosure. Apparently, the described embodiments are some, but not all, of the embodiments of the present disclosure. Based on the described embodiments of the present disclosure, all other embodiments obtained by those of ordinary skill in the art without inventive efforts fall within the protection scope of the present disclosure.

Unless otherwise indicated, the technical or scientific terms used in the present disclosure shall have usual meanings understood by a person of ordinary skill in the art to which the present disclosure belongs. The word "including"

or "comprising" and the like, means that an element or item preceding the word covers an element or item listed after the word and the equivalent thereof, without excluding other elements or items. The word "connection" or "coupling" and the like is not restricted to physical or mechanical connection, but may include electrical connection, whether direct or indirect. The terms "inside", "outside", "up", "down", etc., are used to indicate relative positional relationships, and when an absolute position of a described object changes, the relative positional relationships may change accordingly.

It should be noted that the dimensions and shapes of the figures in the drawings do not reflect true proportions, but are intended to be illustrative of the invention only. And throughout the same or similar labeling denotes the same or similar elements or elements having the same or similar function.

FIG. 1 shows a schematic diagram of a pixel structure in which a circular blind hole H is provided in an AA area of a display panel in the related art. As shown in FIG. 1, the AA area includes a plurality of sub-pixels 10 arranged in an array, such as R, G, and B sub-pixels, and the R, G, and B sub-pixels form a pixel unit P. In order to adapt to an irregular boundary Y1 of the display panel, a portion of the pixel unit P is removed in a position close to the irregular boundary Y1, resulting in the formation of a plurality of step areas T in the AA area near the irregular boundary Y1, and an area Q between the irregular boundary Y1 and the step areas T cannot be provided with a complete pixel unit and is blocked by a black matrix (BM), and pixel units P located in the step areas T are normally illuminated during the display, but the black matrix in the area Q is almost impermeable to light (with a luminance of zero), and the luminance difference between the step areas T and the area Q is large to form a jagged feeling, and the pattern at a position where the irregular boundary Y1 is located is not rounded and smooth when displayed, affecting the display effect of the display panel.

Figure 2:
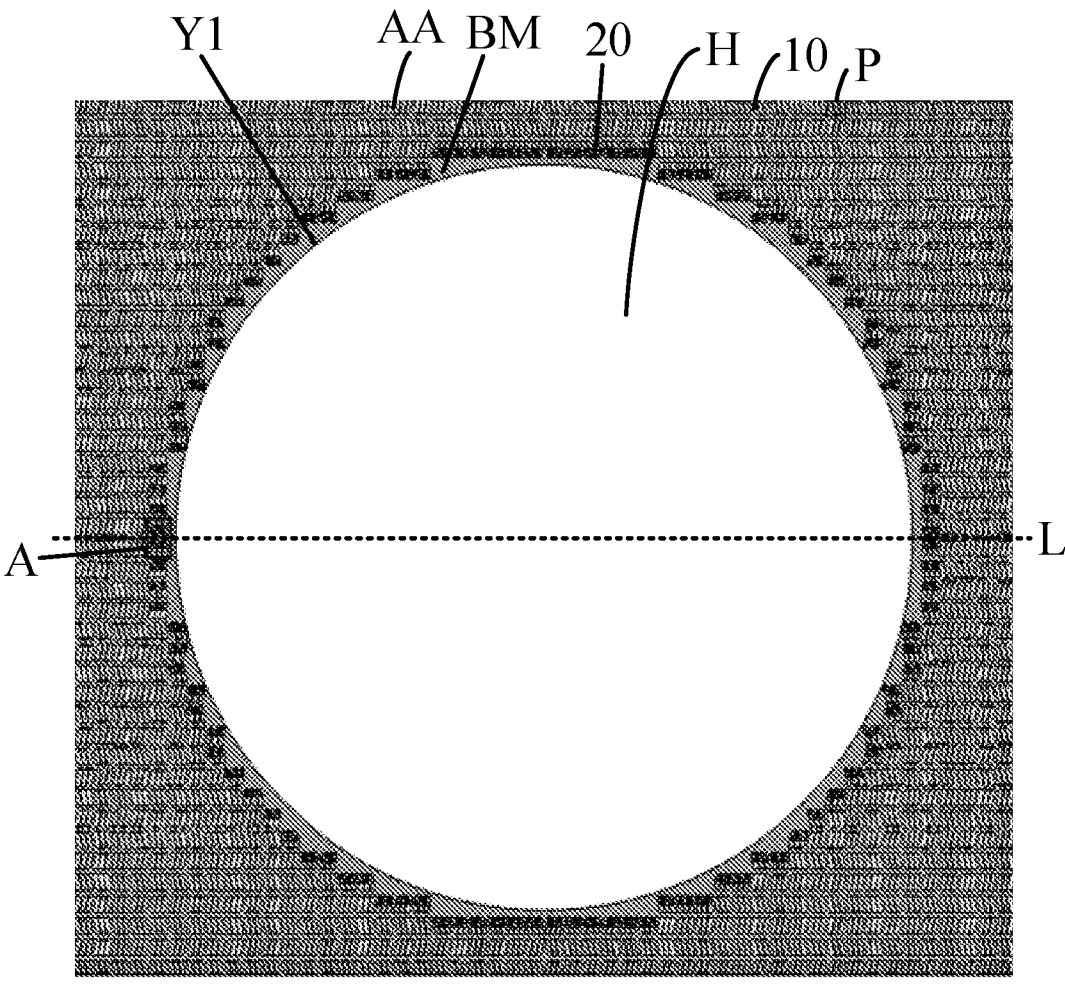
FIG. 2 is another schematic diagram of a pixel structure in which a blind hole is provided in an AA area of a display panel in the related art.

In the related art, to solve the phenomenon of jaggedness at the position where the irregular boundary Y1 is located when the pixel structure shown in FIG. 1 is displayed, a commonly way is to block the pixel units P close to the irregular boundary Y1 with a black matrix (BM) as well, and due to the blocking of the BM, the pixel opening area of the pixel units close to the irregular boundary Y1 is made smaller, so that in a direction from the irregular boundary Y1 to the AA area, a certain gray scale transition effect is obtained, to realize the brightness gradient to weaken the jaggedness phenomenon, as shown in FIG. 2. However, as shown in FIG. 2, the circular blind hole H is divided into upper and lower portions (i.e., the upper and lower portions of the dashed line L) in the related art, and the BMs in the upper and lower portions of the dashed line L are both to block an area of the pixel units P that are close to the irregular boundary Y1, i.e., the BMs in the upper portion of the dashed line L are both to block the lower portion of the pixel units P, and the BMs in the lower portion of the dashed line L are all to block the upper portion of the pixel units P. Specifically, as shown in FIG. 2, the blocking manner of BM makes the BMs in the upper and lower pixel units P (within the dashed box A) that are most adjacent to the dashed line L be adjacent to each other, which results in a sudden change in display brightness at the position where the dashed line L is located as shown in FIG. 2, thereby resulting in the phenomenon of jaggedness still being present at the position where the dashed line L is located.

Figure 3:
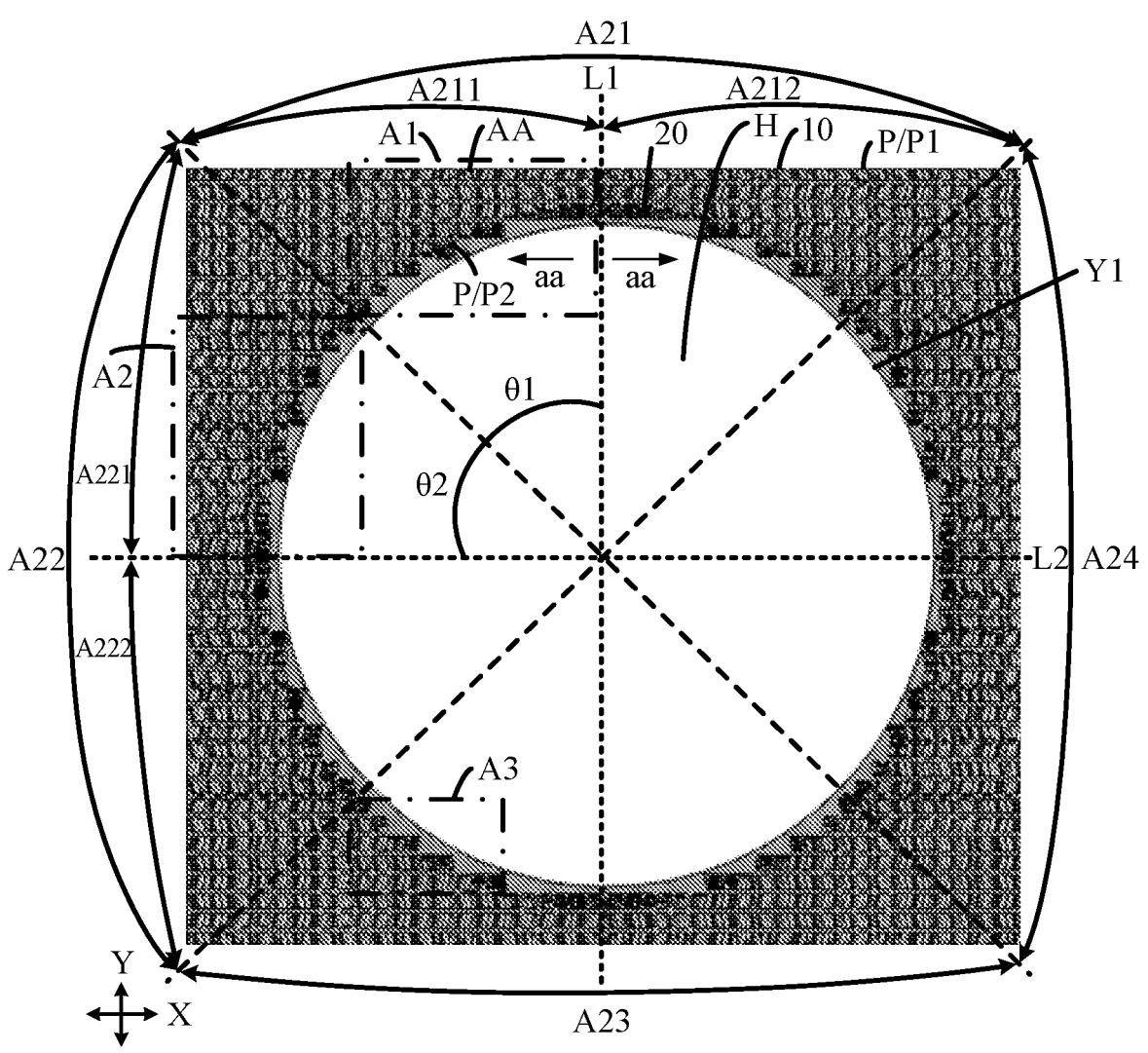
FIG. 3 is a schematic diagram of a pixel structure of a display panel provided by embodiments of the present disclosure.
Figure 4:
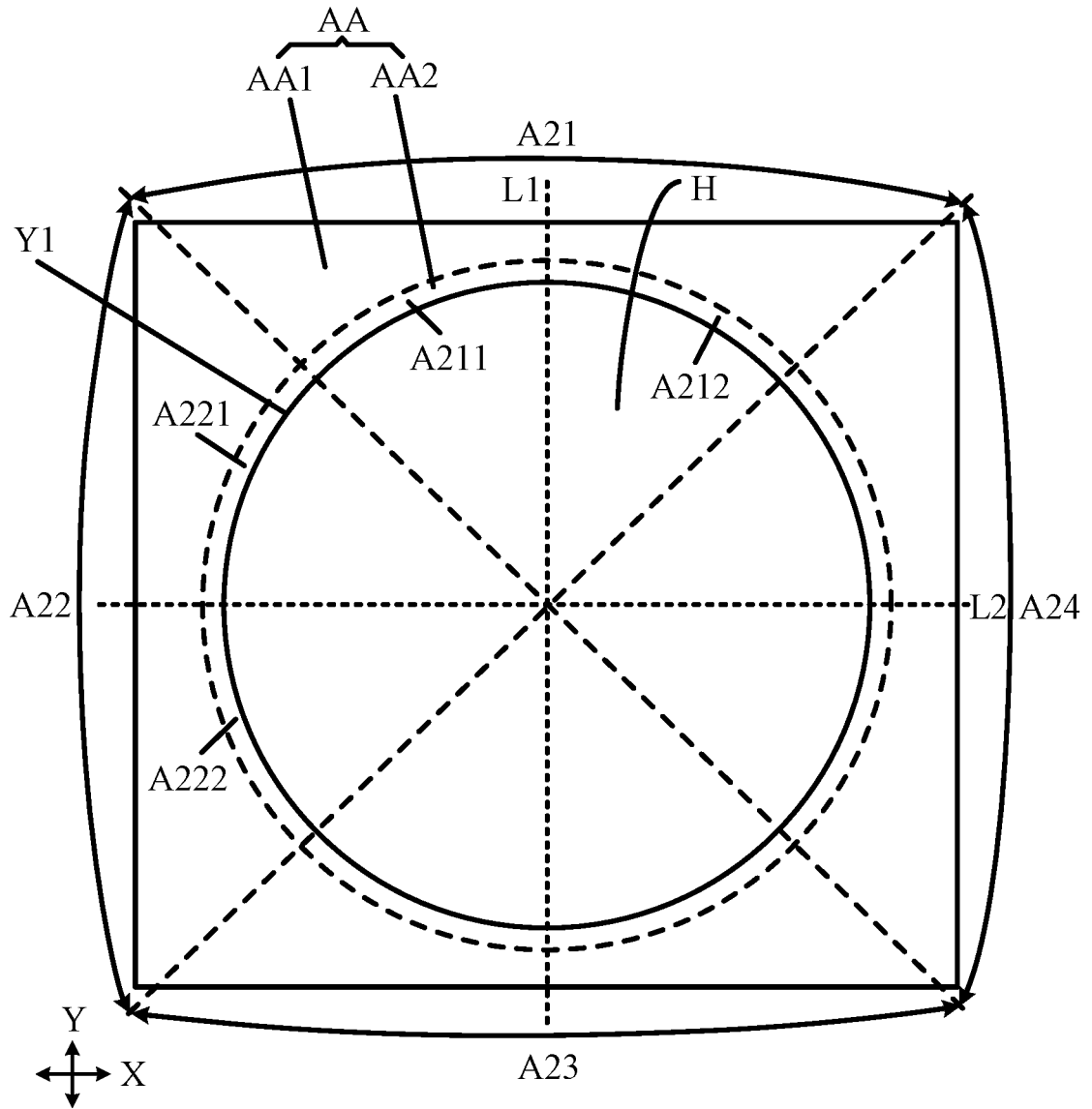
FIG. 4 is a schematic diagram of the display area corresponding to FIG. 3.
Figure 5:
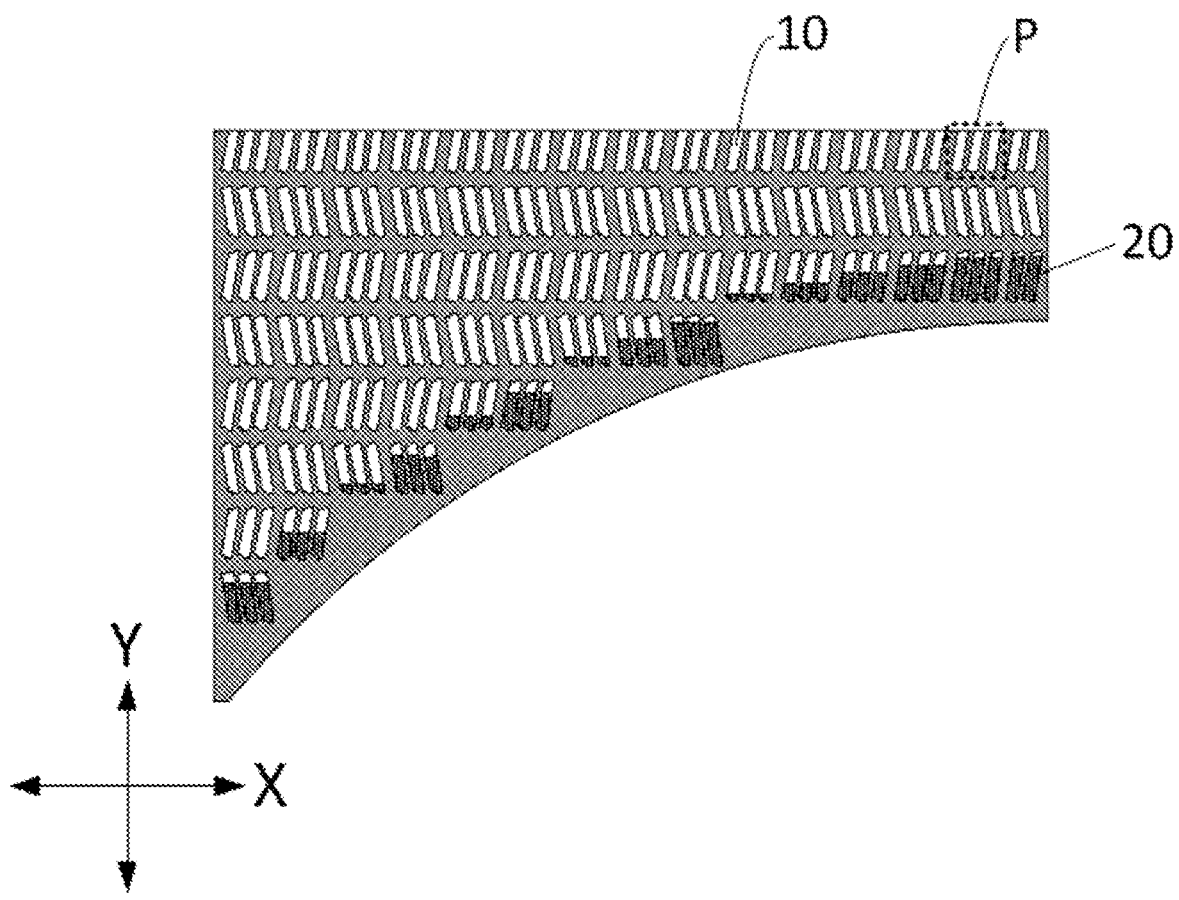
FIG. 5 is a schematic diagram of a local structure within a dashed line box A1 in FIG. 3.
Figure 6:
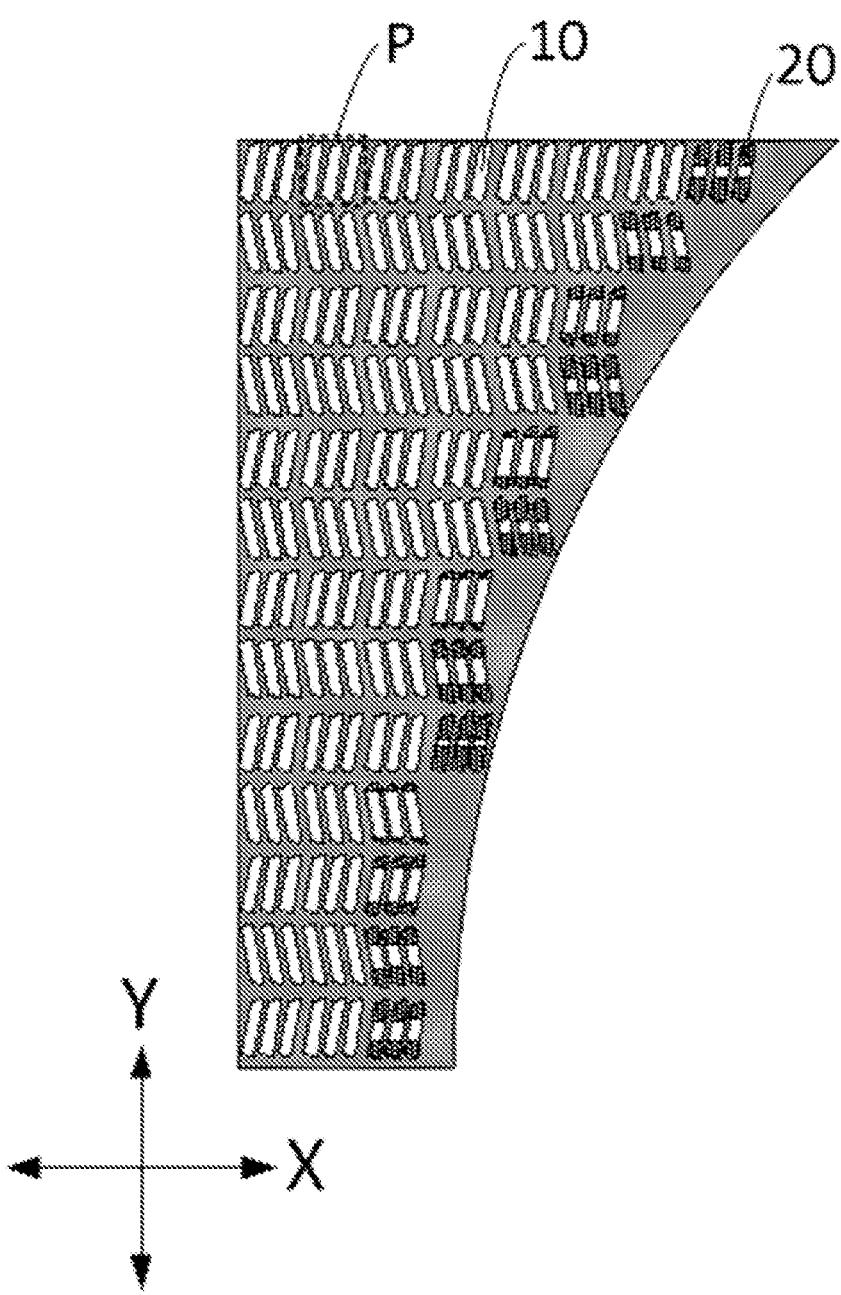
FIG. 6 is a schematic diagram of a local structure within a dashed line box A2 in FIG. 3.
Figure 7:
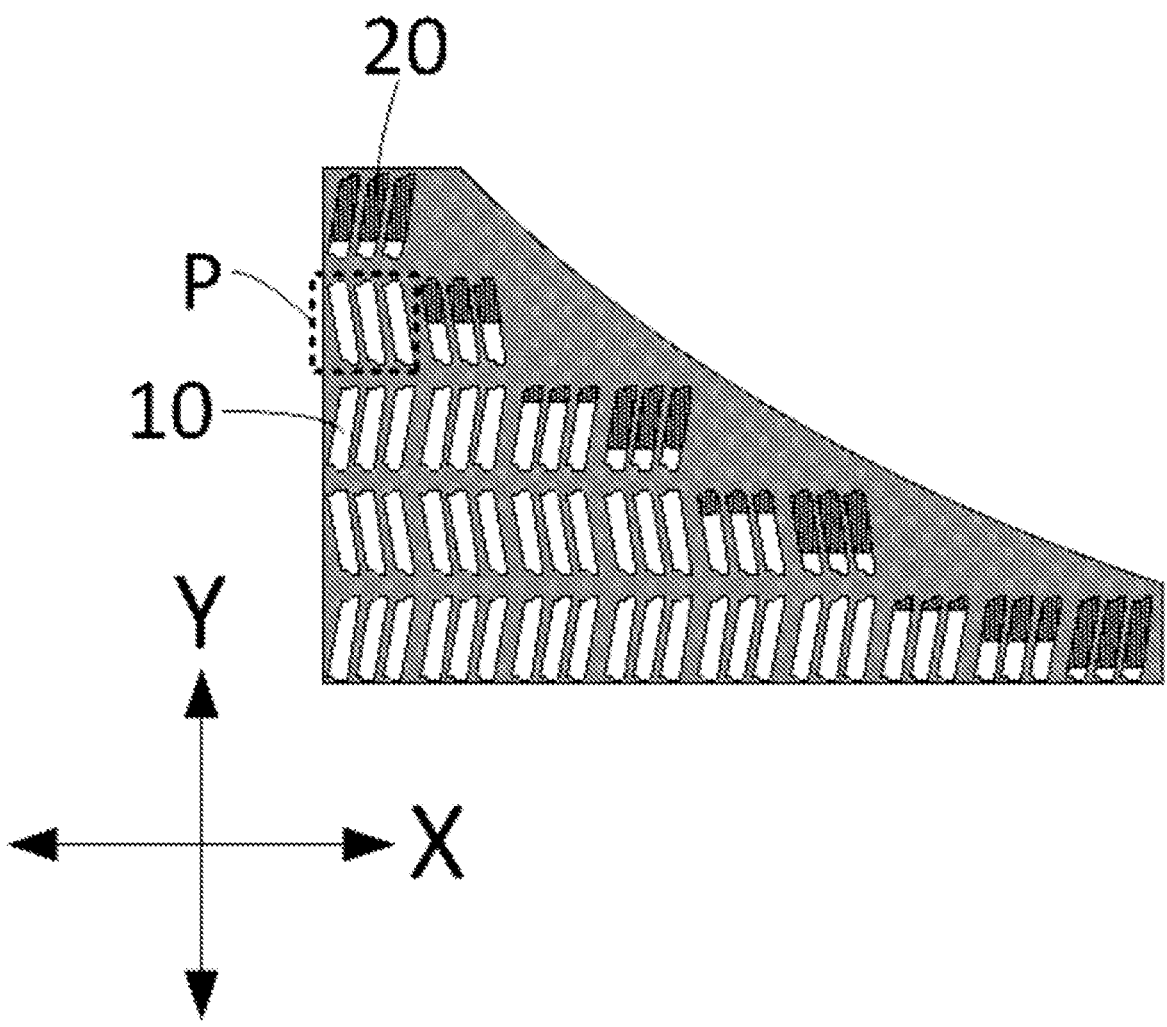
FIG. 7 is a schematic diagram of a local structure within a dashed line box A3 in FIG. 3.

In view of this, in order to solve the above technical problem, the present disclosure provides a display panel, as shown in FIG. 3-FIG. 7. FIG. 3 is a schematic diagram of a pixel structure in which a blind hole is provided in a display area AA of the display panel. FIG. 4 is a schematic diagram of the display area corresponding FIG. 3 for clarity. FIG. 5 is a schematic diagram of a local structure within a dashed box A1 in FIG. 3. FIG. 6 is a schematic diagram of a local structure within a dashed box A2 in FIG. 3. FIG. 7 is a schematic diagram of a local structure within a dashed box A3 in FIG. 3. The display panel has a display area AA, the display area AA has an irregular boundary Y1, the display area AA includes a main display area AA1 and a transition display area AA2 located between the main display area AA1 and the irregular boundary Y1.

The display area AA includes a plurality of sub-pixels 10 arranged in an array along a row direction X and a column direction Y. Each sub-pixel 10 in the transition display area AA2 has a light-shielding block 20, and an area of the light-shielding block 20 is smaller than an area of the sub-pixel 10.

The transition display area AA2 is divided into a first area A21, a second area A22, and a third area A23 successively provided in sequence along an extension direction of the irregular boundary Y1.

In the first area A21 and the third area A23, each of the sub-pixels 10 includes one light-shielding block 20, and the light-shielding block 20 in each of the sub-pixels 10 is provided close to the irregular boundary Y1.

In the second area A22, two light-shielding blocks 20 are included in each of the sub-pixels 10, and one of the light-shielding blocks 20 in each of sub-pixels 10 is provided close to the first area A21, and the other one of the light-shielding blocks 20 is provided close to the third area A23.

The above display panel provided by the embodiments of the present disclosure can correspondingly reduce original light transmittance of each sub-pixel 10 in the transition display area AA2, and reduce original brightness of the sub-pixel 10, by providing a light-shielding block 20 in each sub-pixel 10 of the transition display area AA2 to block a portion of an area of the sub-pixel 10. In this way, the brightness of the transition display area AA2 can be reduced as a whole, so that the acuity of the human eyes for capturing the display image around the irregular boundary Y1 is reduced in the process of displaying, and ultimately the visual effect of a sense of jaggedness in the area where the aforementioned irregular boundary Y1 is located can be reduced. In addition, in the present disclosure, the transition display area AA2 is re-divided into the first area A21, the second area A22, and the third area A23, and the light-shielding block 20 used in the different areas block different positions of the sub-pixel 10, such as in FIG. 3, the first area A21 blocks the lower portion of the sub-pixel 10 (with the opening of the sub-pixel in the upper portion), the second area A22 blocks the upper portion and the lower portion of the sub-pixel 10 (with the opening of the sub-pixel in the middle), and the third area A13 blocks the upper portion of the sub-pixel 10 (with the opening of the sub-pixel in the lower portion); this mitigates the problem of displaying a sudden change in brightness at the boundaries between the upper and lower areas of the division in the related art. Therefore, the sub-pixel 10 blocking mode of the present disclosure makes the simulation effect of the grayscale transition in adjacent areas smoother, which is more conducive to reducing the sense of jaggedness.

Optionally, as shown in FIG. 3, the plurality of sub-pixels 10 may include a plurality of red sub-pixels (R), a plurality of green sub-pixels (G), and a plurality of blue sub-pixels (B). Sub-pixels in the same row are arranged in the form of R, G, B, R, G, B . . . sub-pixels in the same column are of the same color, and adjacent R, G, and B in the row direction constitute a pixel unit P. Of course, the colors and the arrangement of the sub-pixels are not limited to the arrangement shown in FIG. 3 of the present disclosure.

In specific implementation, in the above display panel provided by embodiments of the present disclosure, as shown in FIG. 3 and FIG. 4, the irregular boundary Y1 is circular, and of course, it may also be oval or other curved shapes, and the transition display area AA2 is arranged around the irregular boundary Y1, and the transition display area AA2 further includes a fourth area A24 between the first area A21 and the third area A23.

In the fourth area A24, each sub-pixel 10 includes two light-shielding blocks 20, and one of the light-shielding blocks 20 in each sub-pixel 10 blocks a portion of the sub-pixels 10 close to the first area A21, and the other one of the light-shielding blocks 20 blocks a portion of the sub-pixels 10 close to the third area A23. Specifically, the sub-pixel 10 blocking mode of the fourth area A24 is the same as the sub-pixel 10 blocking mode of the second area A22, such that the annular transition display area AA2 is sequentially divided into the first area A21, the second area A22, the third area A23, and the fourth area A24, and the sub-pixel 10 blocking mode provided by embodiments of the present disclosure will not cause the two adjacent areas in the transition display area AA2 to have a display brightness abruptly, the present disclosure can make the grayscale transition simulation effect of the two adjacent areas in the transition display area AA2 smoother, which is more conducive to reducing the sense of jaggedness.

In specific implementation, in the above display panel provided by embodiments of the present disclosure, as shown in FIG. 3 to FIG. 7, a plurality of sub-pixels 10 with different light-emitting colors and adjacent to each other form a pixel unit P, and each sub-pixel 10 of the same pixel unit P in the transition display area AA2 has the light-shielding block 20 with the same area. In this way, the light transmittance of every sub-pixel 10 of the same pixel unit P in the transition display area AA2 may be the same, so that the problem of over-brightness of a single color in the same pixel unit P can be avoided.

In specific implementation, in the above display panel provided by embodiments of the present disclosure, as shown in FIG. 3 to FIG. 7, the display area AA includes a first centerline L1 extending along the column direction Y and a second centerline L2 extending along the row direction X. The first area A21 includes a first sub-area A211 and a second sub-area A212 located at both sides of the first centerline L1.

In the first sub-area A211 and the second sub-area A212, at least one pixel unit P is provided in each row, and areas of the light-shielding blocks 20 in various pixel units P of each row of the pixel units P gradually decrease along the row direction X and along a direction (aa) in which the transition display area AA2 points toward the main display area AA1. In this way, the closer to the irregular boundary Y1 the lower the transmittance of the sub-pixel 10 in the pixel unit P is, and the brightness of the periphery of the irregular boundary Y1 can be reduced to reduce the sense of jaggedness. At the same time, the further away from the irregular boundary Y1 the higher transmittance of the sub-pixel 10 in the pixel unit P is, so that the brightness of the sub-pixel 10 can be increased step by step along the aa direction, and an uniform transition of brightness can be realized, the brightness difference of adjacent pixel units P can be reduced, and the brightness of a plurality of pixel units P which are arranged sequentially can be smoothly transitioned, thereby further weakening the sense of jaggedness of the visual effect of the area where the irregular boundary Y1 is located in the display process, and improving the display effect of the display panel.

In specific implementation, in the above display panel provided by embodiments of the present disclosure, as shown in FIG. 3 to FIG. 7, the pixel units P located within the main display area AA1 are first pixel units P1, and the pixel units P located within the transition display area AA2 are second pixel units P2.

In the first sub-area A211 and the second sub-area A212, except for the first row of the second pixel units P, the second pixel unit P2, closest to the irregular boundary Y1, of the second pixel units P2 in the remaining rows of the second pixel units P2 is located in the same column as the first pixel unit P1, closest to the irregular boundary Y1, of the first pixel units P1 in the previous row. This can make all the second pixel units P2 in the first area A21 corresponding to the irregular boundary Y1 be provided with a light-shielding block, and make the brightness in the first area A21 uniform, so that the brightness from the first area A21 to the main display area AA1 can be smoothly transitioned, and the sense of jaggedness at the position where the irregular boundary Y1 is located can be further reduced.

In specific implementation, in order to further reduce the sense of jaggedness at the position where the irregular boundary Y1 is located, in the above display panel provided by embodiments of the present disclosure, as shown in FIG. 3, the first sub-area A211 and the second sub-area A212 may be symmetrically arranged about the first centerline L1. Of course, it is not limited to this.

In specific implementation, in order to further reduce the sense of jaggedness at the position where the irregular boundary Y1 is located, in the above display panel provided by the embodiments of the present disclosure, as shown in FIG. 3, the third area A23 and the first area A21 may be symmetrically arranged about the second centerline L2. Of course, it is not limited to this.

In specific implementation, in the above display panel provided by embodiments of the present disclosure, as shown in FIG. 3 to FIG. 7, the second area A22 includes a third sub-area A221 and a fourth sub-area A222 disposed at both sides of the second centerline L2.

In the third sub-area A221 and the fourth sub-area A222, the pixel unit P closest to the irregular boundary Y1 in each row has a light-shielding block 20, at least one pixel unit P is provided in each column, and areas of the light-shielding blocks 20 in various pixel units P of the same column gradually increase along the column direction Y. This can make the light-shielding blocks 20 provided to be within all of the pixel units P in the second area A22 corresponding to the irregular boundary Y1, and make the brightness in the second area A22 uniform, so that the brightness from the second area A22 to the main display area AA1 can be smoothly transitioned, and the sense of jaggedness at the position where the irregular boundary Y1 is located can be further reduced.

In specific implementation, in order to further reduce the sense of jaggedness at the position where the irregular boundary Y1 is located, in the above display panel provided by the embodiments of the present disclosure, as shown in FIG. 3, the third sub-area A221 and the fourth sub-area A222 may be symmetrically provided about the second centerline L2. Of course, it is not limited to this.

In specific implementation, in order to further reduce the sense of jaggedness at the position of the irregular boundary Y1 is located, in the above display panel provided by the embodiments of the present disclosure, as shown in FIG. 3, the fourth area A24 and the second area A22 may be symmetrically provided about the first centerline L1. Of course, it is not limited to this.

In specific implementations, as shown in FIG. 3, a width of the transition display area AA2 is not limited to the width shown in FIG. 3 and may be set as desired.

In specific implementation, as shown in FIG. 3, along the aa direction, the number of pixel units P in the same row of pixel units P in which the areas of the light-shielding blocks 20 gradually decrease is not limited to six, three, or two, and each pixel unit P corresponds to a display brightness, and the display brightness of different pixel units P is different (different grayscales), for example, in the transition display area AA2, a difference between grayscales of pixels corresponding to two adjacent pixel units P in the same row may be an integer multiple of 8, 16, or 32.

Specifically, the brightness change from the darkest to the brightest when the display panel is displayed has a total of 256 brightness levels ranging from 0 to 255, which is referred to as 256 grayscales, and by adopting the light-shielding block to adjust the area of the opening of the sub-pixel in the embodiments of the present disclosure, the number of pixel units P in the same row in the transition display area AA2 can be pre-designed, for example, the difference between the grayscales of the pixels corresponding to the two adjacent pixel units P can be an integer multiple of 16, and 14 pixel units P may be pre-designed in the same row in the transition display area AA2, and the difference between the grayscales of two adjacent pixel units P is an integer multiple of 16, for example, the sub-pixels in the pixel unit P closest to the irregular boundary Y1 may be of 15 grayscales, and the sub-pixels in the pixel unit P furthest from the irregular boundary Y1 may be of 239 grayscales. Of course, the difference in grayscale values between pixel units P of different brightness in the display panel may be designed according to different brightness requirements, and the above difference in grayscales between adjacent pixel units P of an integer multiple of 16 is only one possible embodiment, and the present disclosure is not limited thereto.

In specific implementation, in the above display panel provided by embodiments of the present disclosure, as shown in FIG. 3, a central angle (201) of the first area A21 and the third area A23 may be 71°~81°, i.e., $\theta_1$ is 35.5° ~40.5°; preferably, the central angle (201) of the first area A21 and the third area A23 may be 76°, i.e., $\theta_1$ is 38°; a central angle (202) of the second area A22 and the fourth area A24 may be 99° ~109°, i.e. $\theta_2$ is 49.5° to 54.5°; preferably, the central angle (202) of the second area A22 and the fourth area A24 is 104°, i.e. $\theta_2$ is 52°. This can make the brightness transition effect of the two adjacent areas among the first area A21, the second area A22, the third area A23, and the fourth area A24 more natural and smooth, and there will be no problem of sudden change in brightness.

In an optional embodiment, the first sub-area A211 and the second sub-area A212 are symmetrical about the first centerline L1, the third sub-area A221 and the fourth sub-area A222 are symmetrical about the second centerline L2, and there are also included a fifth sub-area and a sixth sub-area, the fifth sub-area and the sixth sub-area are symmetrical about the first centerline L1, and an area formed by the fifth sub-area and the sixth sub-area and an area formed by the first sub-area A211 and the second sub-area A212 are symmetrical about the second centerline L2. A seventh sub-area and an eighth sub-area are further included, the seventh sub-area and the eighth sub-area are symmetrical about the second centerline L2, and an area formed by the seventh sub-area and the eighth sub-area and the area formed by the third sub-area A221 and the fourth sub-area A222 are symmetrical about the first centerline L1. The eight sub-areas described above correspond to equal central angles, all of which are 45°. That is, the second area A22 may include the above third sub-area A221 and fourth sub-area A222, and the first sub-area A211 and the fifth sub-area. That is, the second area A22 includes an increasing or decreasing change in the area of the light-shielding block 20 within each pixel unit P along the column direction Y (the third sub-area A221 and the fourth sub-area A222), and an increasing or decreasing change in the area of the light-shielding block 20 within each pixel unit P along the row direction X (the first sub-area A211 and the fifth sub-area). The fourth area A24 and the second area A22 are symmetrical about the first centerline L1.

In specific implementation, in the above display panel provided by embodiments of the present disclosure, as shown in FIG. 3, a shape of the light-shielding block 20 and a shape of the sub-pixel 10 may be rectangular, and the width of the light-shielding block 20 is the same as the width of the sub-pixel 10, such that the height of the light-shielding block 20 is less than the height of the sub-pixel 10. Specifically, the material of the light block 20 may be a black matrix (BM).

Specifically, as shown in FIG. 3, there are light-shielding strips 30 arranged horizontally and vertically for defining a plurality of sub-pixels 10, a material of the light-shielding strips 30 and a material of the light-shielding blocks 20 are the same, both being BM and of one-piece structure. In this way, the light-shielding strips 30 and the light-shielding blocks 20 can be formed by a single composition process to reduce production costs.

In specific implementation, in order to make the brightness transition effect of the second area and the fourth area more natural and smooth, in the above display panel provided by embodiments of the present disclosure, as shown in FIG. 3, two light-shielding blocks 20 in the sub-pixel 10 may be symmetrically disposed about a center of the sub-pixel 10 in the second area A22 and the fourth area A24.

In specific implementation, in the above display panel provided by the present disclosure embodiment, as shown in FIG. 3, the embodiments of the present disclosure are based on an example that an annular blind hole H is a circular, of course it can also be oval. In specific implementation, the above display panel provided by the embodiment of the present disclosure is exemplified by the display area having a blind hole, but of course is not limited thereto. For example, the display panel of the embodiments of the present disclosure may itself be a irregular shaped display panel such as a circular or an oval display panel, or the display panel of the embodiments of the present disclosure may be a irregular shaped display panel having R corners, all of which may adopt the embodiments of repartitioning the transition display area to design and block sub-pixels provided by the embodiments of the present disclosure.

In specific implementation, other functional structures known to those skilled in the art may be included in the above display panel provided by the embodiments of the present disclosure, and the embodiments of the present disclosure are only intended to schematically illustrate the partitioned blocking method of the sub-pixels, so that the display panel will not experience sudden changes in brightness.

Based on the same inventive concept, the embodiments of the present disclosure also provide a display apparatus including any of the above display panels provided by the embodiments of the present disclosure, as shown in FIG. 3, the display area AA of the display panel has a circular or oval blind hole H for placing an optical component.

Of course, the shape of the display area of the above display panel provided by the embodiments of the present disclosure may be circular or oval, i.e., the display panel itself may be a irregular shaped display panel such as circular or oval display panel, such as a wearable display product and the like.

The display apparatus may be: a cell phone, a tablet computer, a television, a display, a laptop computer, a digital photo frame, a navigator, and any other product or component with a display function. The implementation of the display apparatus can be seen in the above embodiments of the display panel, and the repetition will not be repeated.

In some embodiments, the above display panel may be a liquid crystal display (LCD) panel, and the display apparatus further includes a backlight module, and the display panel is located on a light-emitting side of the backlight module.

Of course, in specific embodiments, the above display panel may also be an organic light emitting display (OLED) panel.

Embodiments of the present disclosure provide a display panel and a display apparatus, by providing a light-shielding blocking in each sub-pixel of the transition display area to block a portion of the area of the sub-pixel, the original light transmittance of each sub-pixel in the transition display area can be reduced accordingly, and the original brightness of the sub-pixel can be reduced. In this way, the brightness of the transition display area can be reduced as a whole, so that in the process of displaying, the acuity of the human eyes for capturing the display image around the irregular boundary is reduced, and ultimately, the sense of jaggedness of the visual effect in the above area where the irregular boundary is located can be reduced. In addition, in the present disclosure, the transition display area is re-divided into the first area, the second area, and the third area, and the light-shielding blocks used in the different areas block the different positions of the sub-pixels, for example, in FIG. 3, the first area blocks the lower portion of the sub-pixels (with the openings of the sub-pixels in the upper portion), the second area blocks the upper portion of the sub-pixels and lower portion of the sub-pixels (with the openings of the sub-pixels in the middle), and the third area blocks the upper portion of the sub-pixels (with the openings of the sub-pixels in the lower portion); this mitigates the problem of sudden changes in display brightness at the boundaries between the upper and lower areas of the division in the related art. Therefore, the sub-pixel blocking mode of the present disclosure makes the simulation effect of the grayscale transition in adjacent areas smoother, which is more conducive to reducing the sense of jaggedness.

Although the preferred embodiments of the present disclosure have been described, those skilled in the art will be able to make additional changes and modifications to these embodiments once the basic inventive concepts are apparent. Therefore, it is intended that the appended claims be construed to include the preferred embodiments and all changes and modifications that fall within the scope of this disclosure.

Obviously, those skilled in the art can make various changes and modifications to the embodiments of the present disclosure without departing from the spirit and scope of the embodiments of the present disclosure. In this way, if these modifications and variations of the embodiments of the present disclosure fall within the scope of the claims of the present disclosure and equivalent technologies, the present disclosure is also intended to include these modifications and variations.

What is claimed is:

1. A display panel, having a display area, wherein the display area has an irregular boundary and comprises:

a main display area; and a transition display area between the main display area and the irregular boundary; wherein the display area comprises a plurality of sub-pixels arranged in an array along a row direction and a column direction, each sub-pixel in the transition display area has a light-shielding block, and an area of the light-shielding block is smaller than an area of the sub-pixel;

the transition display area is divided into a first area, a second area and a third area successively disposed in sequence along an extension direction of the irregular boundary;

in the first area and the third area, each sub-pixel comprises one light-shielding block, and the light-shielding block in each sub-pixel is provided close to the irregular boundary; and in the second area, each sub-pixel comprises two light-shielding blocks, and one of the two light-shielding blocks in each sub-pixel is provided close to the first area, and an other one of the two light-shielding blocks is provided close to the third area;

wherein a plurality of sub-pixels adjacent to each other and having different light-emitting colors form a pixel unit; pixel units located within the main display area are first pixel units, and pixel units located within the transition display area are second pixel units;

the display area comprises a first centerline extending along the column direction, the first area comprises a first sub-area and a second sub-area located at both sides of the first centerline; and in the first sub-area and the second sub-area, except for second pixel units in a first row, a second pixel unit, closest to the irregular boundary, of second pixel units in remaining rows is located in a same column as a first pixel unit, closest to the irregular boundary, of first pixel units in a previous row.

2. The display panel according to claim 1, wherein the irregular boundary comprises circular or oval, the transition display area is arranged around the irregular boundary, and the transition display area further comprises a fourth area between the first area and the third area; and in the fourth area, each sub-pixel comprises two light-shielding blocks, and one of the two light-shielding blocks in each sub-pixel blocks a portion of the sub-pixel close to the first area, and an other one of the two light-shielding blocks blocks a portion of the sub-pixel close to the third area.

3. The display panel according to claim 1, wherein various sub-pixels in a same pixel unit located within the transition display area have light-shielding blocks of a same area.

4. The display panel according to claim 3, wherein:

in the first sub-area and the second sub-area, at least one pixel unit is provided in each row, and areas of light-shielding blocks in various pixel units of each row gradually decrease along the row direction and along a direction in which the transition display area points toward the main display area.

5. The display panel according to claim 1, wherein the first sub-area and the second sub-area are symmetrically arranged about the first centerline.

6. The display panel according to claim 1, wherein the display area further comprises a second centerline extending along the row direction, and the third area and the first area are symmetrically arranged about the second centerline.

7. The display panel according to claim 3, wherein the display area further comprises a second centerline extending along the row direction, and the second area comprises a third sub-area and a fourth sub-area arranged at both sides of the second centerline; and in the third sub-area and the fourth sub-area, a pixel unit closest to the irregular boundary in each row has the light-shielding block, at least one pixel unit is provided in each column, and areas of light-shielding blocks in various pixel units in a same column gradually increase along the column direction.

8. The display panel according to claim 7, wherein the third sub-area and the fourth sub-area are symmetrically arranged about the second centerline.

9. The display panel according to claim 2, wherein the fourth area and the second area are symmetrically arranged about the first centerline.

10. The display panel according to claim 1, wherein the first area and the third area have a central angle of 71° to 81° and the second area has a central angle of 99° to 109°.

11. The display panel according to claim 10, wherein the first area and the third area have a central angle of 76°, and the second area has a central angle of 104°.

12. The display panel according to claim 1, wherein a shape of the light-shielding block and a shape of the sub-pixel are rectangles, and a width of the light-shielding block is same as a width of the sub-pixel.

13. The display panel according to claim 2, wherein in the second area and the fourth area, the two light-shielding blocks in each sub-pixel are symmetrically arranged about a center of the sub-pixel.

14. A display apparatus, comprising a display panel, wherein the display panel has a display area, and the display area has an irregular boundary and comprises:

a main display area; and a transition display area between the main display area and the irregular boundary; wherein the display area comprises a plurality of sub-pixels arranged in an array along a row direction and a column direction, each sub-pixel in the transition display area has a light-shielding block, and an area of the light-shielding block is smaller than an area of the sub-pixel;

the transition display area is divided into a first area, a second area and a third area successively disposed in sequence along an extension direction of the irregular boundary;

in the first area and the third area, each sub-pixel comprises one light-shielding block, and the light-shielding block in each sub-pixel is provided close to the irregular boundary; and in the second area, each sub-pixel comprises two light-shielding blocks, and one of the two light-shielding blocks in each sub-pixel is provided close to the first area, and an other one of the two light-shielding blocks is provided close to the third area;

wherein a shape of the display area of the display panel comprises circular or oval; or the display area of the display panel has a circular or oval blind hole for placing an optical component;

wherein a plurality of sub-pixels adjacent to each other and having different light-emitting colors form a pixel unit; pixel units located within the main display area are first pixel units, and pixel units located within the transition display area are second pixel units;

the display area comprises a first centerline extending along the column direction, the first area comprises a first sub-area and a second sub-area located at both sides of the first centerline; and in the first sub-area and the second sub-area, except for second pixel units in a first row, a second pixel unit, closest to the irregular boundary, of second pixel units in remaining rows is located in a same column as a first pixel unit, closest to the irregular boundary, of first pixel units in a previous row.

15. The display apparatus according to claim 14, wherein the irregular boundary comprises circular or oval, the transition display area is arranged around the irregular boundary, and the transition display area further comprises a fourth area between the first area and the third area; and in the fourth area, each sub-pixel comprises two light-shielding blocks, and one of the two light-shielding blocks in each sub-pixel blocks a portion of the sub-pixel close to the first area, and an other one of the two light-shielding blocks blocks a portion of the sub-pixel close to the third area.

16. The display apparatus according to claim 14, wherein various sub-pixels in a same pixel unit located within the transition display area have light-shielding blocks of a same area.

17. The display apparatus according to claim 16, wherein:

in the first sub-area and the second sub-area, at least one pixel unit is provided in each row, and areas of light-shielding blocks in various pixel units of each row gradually decrease along the row direction and along a direction in which the transition display area points toward the main display area.

18. The display apparatus according to claim 14, wherein the first sub-area and the second sub-area are symmetrically arranged about the first centerline.

19. The display panel according to claim 16, wherein the display area further comprises a second centerline extending along the row direction, and the second area comprises a third sub-area and a fourth sub-area arranged at both sides of the second centerline; and in the third sub-area and the fourth sub-area, a pixel unit closest to the irregular boundary in each row has the light-shielding block, at least one pixel unit is provided in each column, and areas of light-shielding blocks in various pixel units in a same column gradually increase along the column direction.

20. The display panel according to claim 15, wherein in the second area and the fourth area, the two light-shielding blocks in each sub-pixel are symmetrically arranged about a center of the sub-pixel.

* * * * *